United States Patent [19]

Angle

[11] Patent Number: 4,558,339
[45] Date of Patent: * Dec. 10, 1985

[54] ELECTRICALLY ALTERABLE, NONVOLATILE FLOATING GATE MEMORY DEVICE

[75] Inventor: Rodney L. Angle, Millstone, N.J.

[73] Assignee: RCA Corporation, Princeton, N.J.

[*] Notice: The portion of the term of this patent subsequent to Nov. 22, 2000 has been disclaimed.

[21] Appl. No.: 607,716

[22] Filed: May 7, 1984

Related U.S. Application Data

[63] Continuation of Ser. No. 437,271, Oct. 18, 1982, abandoned.

[30] Foreign Application Priority Data

Mar. 9, 1982 [GB] United Kingdom ............... 8206908

[51] Int. Cl.[4] ............... H01L 29/78; H01L 27/02; H01L 29/04; G11C 11/40
[52] U.S. Cl. ............... 357/23.5; 357/41; 357/59; 365/185
[58] Field of Search ............... 357/23 UT, 41, 59; 365/185

[56] References Cited

U.S. PATENT DOCUMENTS

| | | | |
|---|---|---|---|
| 3,500,142 | 3/1970 | Kahng | 357/23 VT |
| 3,660,819 | 5/1972 | Frohman-Bentchkowsky | 357/23 VT |
| 3,825,946 | 7/1974 | Frohman-Bentchkowsky | 357/23 VT |
| 4,099,196 | 7/1978 | Simko | 357/23 VT |
| 4,203,158 | 5/1980 | Frohman-Bentchkowsky | 357/23 VT |
| 4,336,603 | 6/1982 | Kotecha et al. | 357/23 VT |
| 4,355,375 | 10/1982 | Arakawa | 357/23 VT |
| 4,417,264 | 11/1983 | Angle | 357/23 VT |

OTHER PUBLICATIONS

Hortuchi et al., "FCAT—A Low-Voltage High-Speed Alterable N-Channel Nonvolatile Memory Device", IEEE Trans. Electron Devices, vol. ED-26 (6/79) pp. 914-918.
Gerber et al, "A 1.5 V Single-Supply One-Transistor CMOS EEPROM", IEEE J. Solid-State Circuits, vol. SC-16 (6/81) pp. 195-200.
"16-K EE-PROM Relies on Tunneling for Byte-Erasable Program Storage", W. S. Johnson, Electronics, 2-28-1980, pp. 113-117.
"Electacally Alterable Programmable Logic Array (EALPA)", Hsieh et al, Tecw Dig IEDM, Wash. D.C., pp. 598-601, 12/8/80.

*Primary Examiner*—Gene M. Munson
*Attorney, Agent, or Firm*—Birgit E. Morris; William J. Burke; Henry Steckler

[57] ABSTRACT

A novel, nonvolatile, floating gate memory structure, and a method for its fabrication, is described wherein the floating gate is substantially shielded from the substrate by the program or control gate. The program or control gate is provided with an aperture located over an auxiliary channel region. A portion of the floating gate is formed to extend through the aperture to allow charge to be played on the floating gate.

8 Claims, 7 Drawing Figures

ELECTRICALLY ALTERABLE, NONVOLATILE FLOATING GATE MEMORY DEVICE

This application is a continuation of U.S. application Ser. No. 437,271 filed Oct. 18, 1982, now abandoned.

BACKGROUND OF THE INVENTION

This invention relates, in general, to semiconductor memory devices and more particularly, to electrically alterable, nonvolatile floating gate memory devices.

The microprocessor based systems, as well as the related arts, has long required electrically alterable read only memory (EAROM) elements that were nonvolatile and many such devices have, to some extent, filled this need. However, as the computer arts have become more complex in nature and have required high speeds and greater capacity there now exists the need for a high density memory device that may be easily programmed or "written" and, as the occasion arises, to reprogram ("erase" and "rewrite") the device in the field. To this end, devices are presently available to the design engineers that exhibit nonvolatile characteristics but, as will be discussed, they have inherent shortcomings that are overcome by the subject invention.

One such device resides in the family of Floating Gate Avalanche Metal Oxide Semiconductor (FAMOS) devices. The advantage of this type of device resides in the fact that it is independent of any outside current to maintain the stored information in the event power is lost or interrupted. Since these devices are independent of any outside power there is also no need to refresh the device which feature results in a significant savings in power.

The floating gate family of devices usually has source and drain regions of a given conductivity type, formed in a substrate of the opposite conductivity type, at the surface thereof. Between the source and drain regions, and on the surface of the substrate, a gate structure is formed by first applying a thin insulating layer followed by a conductive layer (the floating gate) followed by a second insulating layer in order to completely surround the floating gate and insulate it from the remainder of the device. A second conductive layer (usually referred to as the control gate) is formed over the second insulating layer (in the region of the floating gate) to complete the gate structure. Such devices are exemplified in U.S. Pat. No. 3,500,142 issued to D. Kahng on Mar. 10, 1970 and U.S. Pat. No. 3,660,819 D. Frohman-Bentchkowsky on May 2, 1972. The major drawback of these devices resides in the fact that high fields are required to produce the necessary avalanche breakdown in order for charge to be placed on the floating gate. Further, to erase the charge appearing on the floating gate, the entire device must be provided with a transparent window so that the chip may be flooded with energy in the ultra violet or x-ray portion of the spectrum. Thus, it is extremely difficult to erase a single "word" without erasing all the charge on the device then requiring that the entire chip be completely reprogrammed. Further, the erasing step required an extremely long period of exposure time, of the order of about 30 to 45 minutes, with the device or chip removed from the equipment.

In recent years, the art has progressed to the point where nonvolatile floating gate read only memory devices have been produced and which are electrically alterable. One such memory cell has been described in detail in an article entitled "16-K EE-PROM Relies on Tunneling for Byte-Erasable Program Storage" by W. S. Johnson, et al., ELECTRONICS, Feb. 28, 1980, pp. 113–117. In this article the authors describe a "Floating-Gate Tunnel Oxide" structure wherein a cell using a polycrystalline silicon (polysilicon) floating gate structure is charged with electrons (or holes) through a thin oxide layer positioned between the polysilicon gate and the substrate. The Fowler-Nordheim tunneling mechanism is used to charge the polysilicon gate. An elevation view of a typical device is described, and shown in FIG. 1 of the article, wherein the floating gate member represents the first polysilicon level. By using this type of structure (a structure wherein the first level polysilicon represents the floating gate and is closest to the substrate, covered by a second polysilicon level) an inordinately high floating gate-to-substrate capacitance is produced. This area of floating gate is necessary in order to maintain close coupling between the first polysilicon level and next deposited or second polysilicon level. It has been found that some manufacturers find it necessary to etch away portions of the first polysilicon level in order to reduce the capacitance between the floating gate and the substrate without substantially reducing the capacitance between the first and second polysilicon levels.

SUMMARY OF THE INVENTION

The nonvolatile memory cell of the subject invention uses the Fowler-Nordheim Tunneling mechanism to charge the polysilicon floating gate. However, in the subject application the polysilicon floating gate is a second level of polysilicon rather than the first level in order to provide a structure wherein the second level polysilicon (the floating gate) is shielded from the substrate by the first level polysilicon. The program or control gate (first level polysilicon) is provided with an aperture and the second level polysilicon (floating gate) is disposed thereover with a small portion of the second level polysilicon floating gate extending through the aperture in the first level polysilicon so that only a relatively small area of the second level polysilicon is coupled to the substrate.

DETAILED DESCRIPTION OF THE PREFERRED EMBODIMENTS

Figure 1:
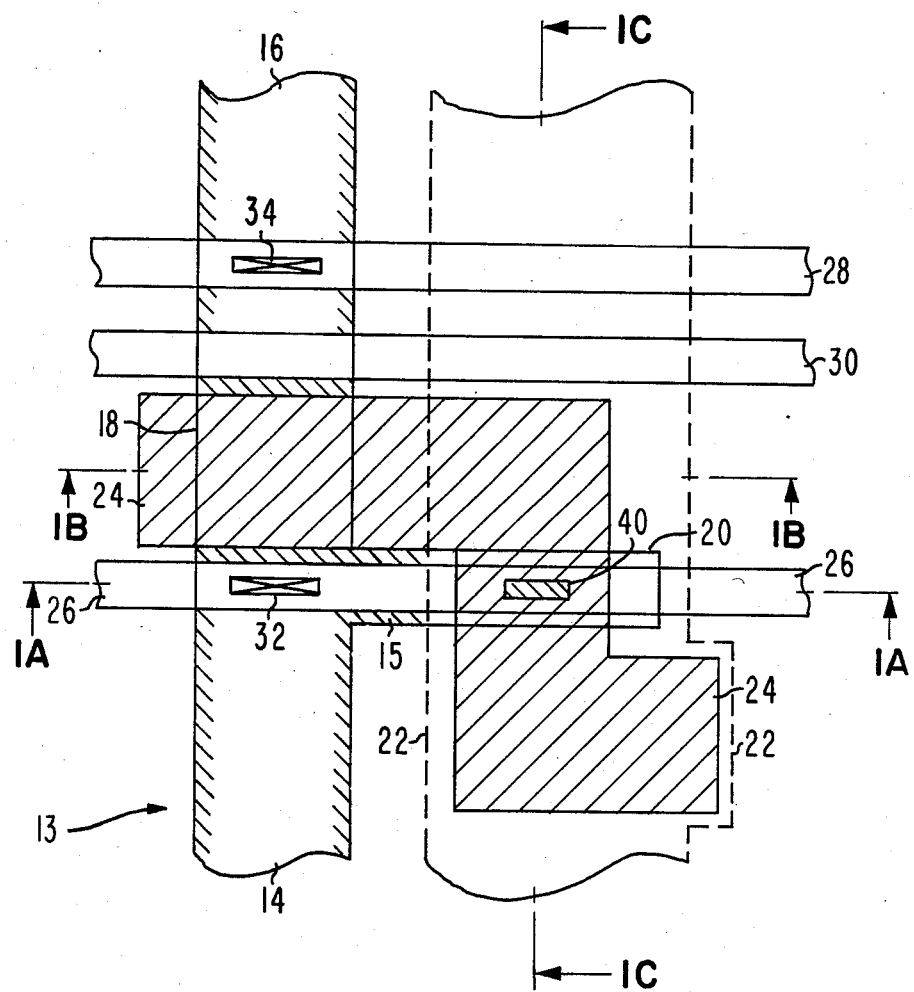
FIG. 1 is a plan view of one embodiment of a memory device made in accordance with the teachings of the subject invention.
Figure 1A:
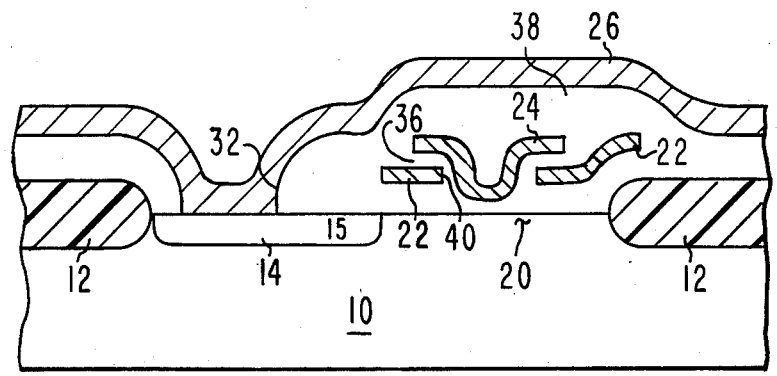
FIG. 1A is a cross-sectional, elevation view of the device of FIG. 1 taken along line 1A—1A of FIG. 1.
Figure 1B:
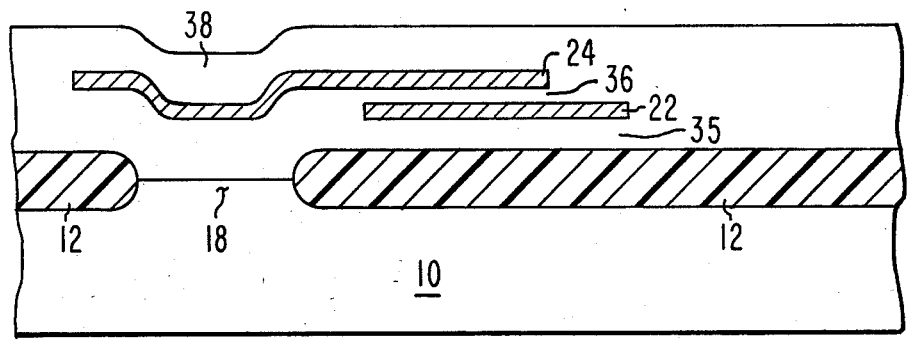
FIG. 1B is a cross-sectional, elevation view of the device of FIG. 1 taken along line 1B—1B of FIG. 1.
Figure 1C:
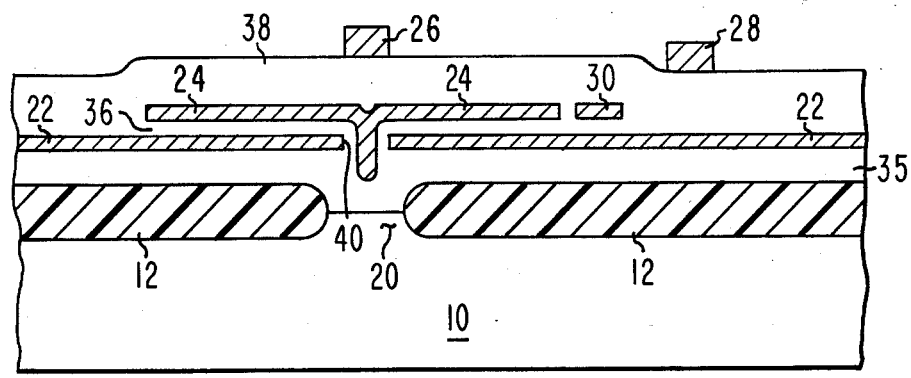
FIG. 1C is a cross-sectional, elevation view of the device of FIG. 1 taken along line 1C—1C of FIG. 1.

Referring to FIGS. 1, 1A, 1B and 1C of my invention, there is shown a substrate 10 having a line 13 consisting of active regions and including doped source and drain regions 14 and 16 respectively separated by channel region 18. At the surface of substrate 10 is formed field oxide 12 which field oxide 12 defines the limits the active regions which also includes source extension 15, auxiliary channel region 20 as well as line 13. Above field oxide 12 and channel regions 18 and 20 is a layer of insulating oxide 35 and, on top of oxide layer 35 is the first level polysilicon layer (program or control gate line) 22. As shown in FIGS. 1, 1A and 1C, the first level polysilicon layer 22 is a line extending in the same general direction as line 13 and is parallel thereto. However, for the sake of clarity, this first level polysilicon (program or control) gate line 22 is shown in FIGS. 1, 1A and 1B as being laterally separated from line 13. It will be understood that good design techniques dictate that first level polysilicon (program or control) gate line 22 may be as close as coincident with line 13 in order to reduce the gate-to-substrate capacitance. Additionally, as shown in FIGS. 1, 1A and 1C, the first level polysilicon (program or control) gate line 22 is provided with an aperture or charging window 40. Source region 14 is shown in FIGS. 1 and 1A as being provided with a source extension 15 which extends laterally outwardly from source region 14 toward the area under first level polysilicon (program or control) gate line 22 and an auxiliary channel portion 20 which is laterally aligned with extension portion 15 to extend under the aperture 40 formed in first level polysilicon (program or control) gate line 22. It is understood that extended portion 15 is doped with the same conductivity modifiers as source region 14 while auxiliary channel region 20, as shown in FIGS. 1A and 1C, is a channel region formed in substrate 10.

As shown in FIGS. 1, 1A, 1B and 1C, a second level polycrystalline silicon floating gate 24 is provided having a generally Z shaped configuration and having the major portion thereof positioned over the first level polysilicon (program or control) gate line 22 and the remainder thereof formed over channel region 18 in line 13. The portion of floating gate 24 over aperture 40 extends down into the aperture and is separated from channel region 20 by a thickness of oxide which is thinner than the oxide layer which insulates the first level polysilicon gate line 22 from substrate 10. Source and drain contact openings 32 and 34 are shown in direct communication with source and drain regions 14 and 16 respectively. Source line 26 makes contact source region 14 through contact opening 32 while drain line 28 makes contact to drain 16 through contact opening 34. As shown in FIGS. 1A, 1B and 1C, drain and source lines 26 and 28 are insulated from the first and second polysilicon layers 22 and 24 by means of insulating layer 38. In addition, at the same time that second level polysilicon floating gate layer 24 is formed there is also formed a select gate (word line) 30, at the same level as floating gate 24 and is also insulated from first level polysilicon layer 22 by oxide layer 36.

As shown in FIGS. 1, and 1A, extended portion 15 is doped with the same conductivity modifiers and is formed at the same time source region 14 is formed. Additionally, it should be noted, that the oxide thickness beneath aperture 40 (FIGS. 1A and 1C) is about 90–120 Angstroms. The thickness of the gate oxide appearing between the first level polysilicon layer 22 and the substrate 10 is of the order of about 1000 Angstroms while the thickness of the oxide layer 36 covering the first level polysilicon layer 22 is of the order of about 2500 Angstroms.

As shown in FIGS. 1A, 1B, and 1C the second level polycrystalline floating gate 24 will be deposited within the aperture formed by window 40 and when it is defined by masking and etching, it is made to extend over the line 13 which will be subsequently defined as the source region 14, channel region 18, and drain region 16. It should be noted that anyone skilled in the art will recognize that in order to achieve an aligned gate device, the doping of source 14 and drain 16 should be accomplished after the gates have been formed. At the time second level polysilicon floating gate 24 is formed, the select gate (word line) 30 is also formed. This was done during the masking and etching of the second level polysilicon layer in a well known manner to simultaneously form both floating gate 24 and select gate (word line) 30. Thereafter, the device is provided with another oxide layer 38 (FIGS. 1A, 1B, and 1C), of the order about 6000 Angstroms, in order to provide the insulation for the subsequent formation of drain and source lines 26 and 28.

After the formation of oxide layer 38, the surface of the device is appropriately masked and etched to form contact openings 32 and 34 (FIGS. 1 and 1A) which communicate with source region 14 and drain region 16 respectively. Thereafter, a layer of aluminum is deposited, masked and etched to form lines 26 and 28 which represent the source line and drain line respectively. As shown in FIGS. 1A, 1B, and 1C field oxide 12 has been grown to insure isolation around this structure and similar adjacent structures.

Referring again to FIGS. 1, 1A, 1B, and 1C, it should now be observed that, to obtain optimum tunneling it is important to maintain as much of the applied field as possible, between the floating gate and substrate. Accordingly, the floating gate (24)-to-substrate (18) capacitance, as well as the floating gate (24)-to-auxiliary channel portion (20) capacitance must be reduced while the program or control gate (22)-to-floating gate (24) capacitance must be increased to as large a value as possible. However, the floating gate (24)-to-channel extension (20) capacitance is governed by the thickness of the oxide layer under window 40. This oxide thickness should not be increased much above a thickness of about 90–120 Angstroms as this would tend to decrease current density which would then require higher fields or longer times to charge the device.

As previously stated, the premise of the invention of the subject application resides in the reversal of the positions of the program (control) gate 22 (not first level polysilicon layer) and the floating gate 24 (now the second level polysilicon). Thus, the second level polysilicon layer (floating gate) 24-to-substrate 18 capacitance is greatly reduced. In fact, this capacitance has been reduced to the point where it is almost negligible due to the presence of the intervening first level polysilicon layer 22 under the second level polysilicon floating gate 24 except for the two critical areas, namely: that portion of floating gate 24 that couples to channel extension 20 through aperture 40 (the charging portion) and that portion of floating gate 24 that couples to channel 18. This latter portion, when charged, determines the threshold level of the device (the threshold determining portion). In this particular instance, the charge mode capacitance is represented by that portion of floating gate 24 that extends through aperture 40.

Another feature of the present invention resides in the fact that a metal or a third level polysilicon bus 26 may now be used as a source line in order to add to the coupling between the source line and the floating gate 24 since the second level polysilicon gate is now positioned to be easily coupled to bus 26. This is a feature which could not be achieved in the prior art.

The following table shows the potentials which are applied to the various elements of the device herein shown, in order to erase, program or write and read the device. In the table, the various potentials shown under the columns entitled "ERASE", "WRITE" AND "READ" are applied to the elements shown under the column entitled "ELEMENT".

| ELEMENT | ERASE | WRITE | READ |
| --- | --- | --- | --- |
| Drain (34) | +20 Volts | 0 Volts | +5 Volts |
| Source (32) | +20 Volts | 0 Volts | 0 Volts |
| Program line (22) | 0 Volts | +20 Volts | +5 Volts |
| Substrate (10) | 0 Volts | 0 Volts | 0 Volts |
| Word line (30) | +20 Volts | +20 Volts | +5 Volts |

Thus, as shown in the above table, the device is erased by placing a 20 volt signal on drain 34, source 32, and word line 30 of FIG. 1. This erase cycle will place a positive charge on floating gate 24 which puts channel region 18 in a low threshold (high conduction) state. However, there will be no electron conduction through channel region 18 unless and until the proper "read" voltages, as indicated in the above table are applied. This provides a convenient method of checking the devices to determine that all elements in an array are, in fact, erased. To "write", a 20 volt signal is placed on program line 22 and on word line 30 which, in effect, now places a negative charge on floating gate 24 which now puts channel region 18 in a high threshold (low conduction state). Under these conditions the negative charge on the floating gate 24 will prevent channel 18 from being inverted and thus no conduction can take place between source 32 and drain 34 during the read cycle. To read the device, that is, to determine whether a high or a low threshold state has been written into the given cell, 5 volts are placed on the drain 34, program line 22 and word line 30. The indication of conduction will thus signify the presence of a low threshold state (written) device.

Figure 2:
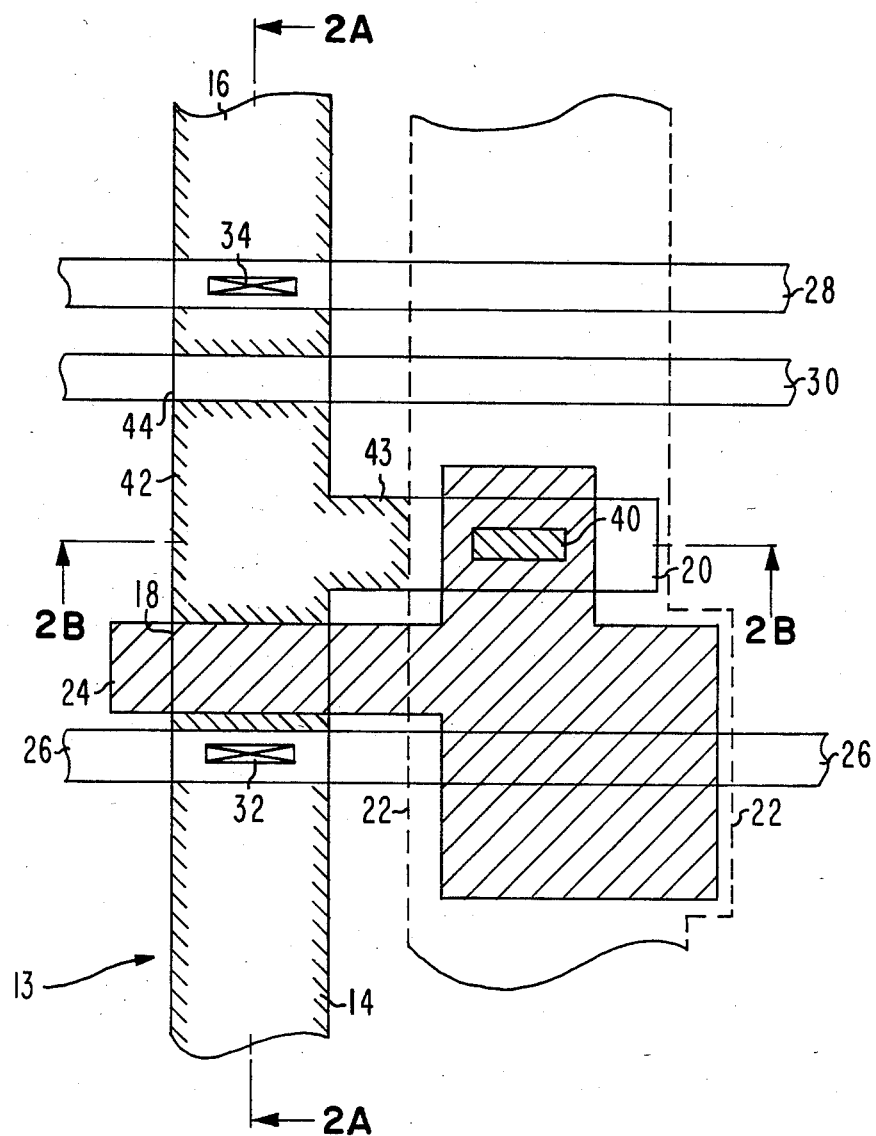
FIG. 2 is a plan view of another embodiment of a memory device made in accordance with the teaching of the subject invention.
Figure 2A:
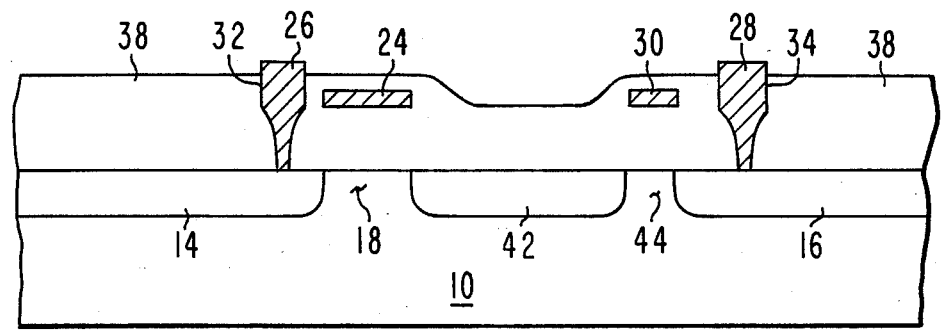
FIG. 2A is a cross-sectional, elevation view of the device of FIG. 2 taken along line 2A—2A of FIG. 2.
Figure 2B:
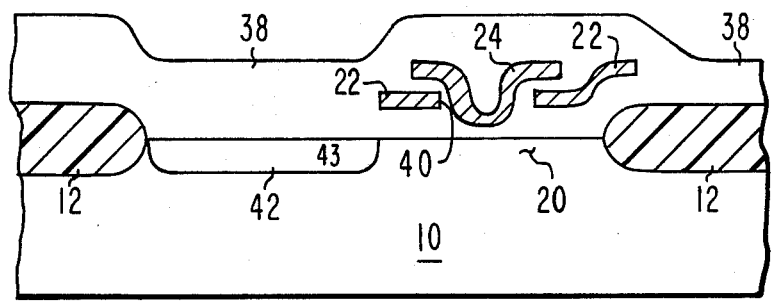
FIG. 2B is a cross-sectional, elevation view of the device of FIG. 2 taken along line 2B—2B of FIG. 2.

Referring now to FIGS. 2, 2A, and 2B there is shown another embodiment of my invention which develops from the embodiment of the prior figures. It will be seen that similar elements in FIGS. 1 and 2 will be similarly numbered. The device shown in FIG. 2 differs from the device shown in FIG. 1 by the deletion of extension 15 at source 14 and instead providing, between source 14 and drain 16, a completely independent channel region 44, doped region 42 and doped extension 43. The doped extension 43 extending in a direction toward first level polysilicon layer 33 in the same manner as described with regard to FIG. 1. However, in this latter embodiment, channel extension 20 is now provided to be extended from doped extension 43 and aperture 40 is provided over channel extension 20. In this embodiment the line 13 containing the source region 14 and drain region 16, as shown in FIG. 2A, consists of channel region 18, doped region 42 and channel region 44 all appearing where source region 14, drain region 16, and channel region 18 occurred in FIG. 1.

FIG. 2B shows the relationship of floating gate 24 to channel region 20 and window 40. In all other respects, the devices of FIGS. 1 and of FIG. 2 will function in much the same manner and will be erased, written and read as set forth in the above table.

The following process sequence is one example of the manner in which my device may be fabricated:
1. Define active regions including line 13, extension 15 and auxiliary channel region 20 (FIG. 1) in FIG. 2 this includes line 13, channel region 44, doped region 42, doped extension 43 and auxiliary channel region 20);
2. Implant or diffuse N— type doant into auxiliary channel region 20;
3. Grow oxide layer 35 to a thickness of about 1000 Angstroms;
4. Deposit first level polysilicon layer 22;
5. Mask and etch first level polysilicon layer 22 including aperture 40;
6. Remove mask and grow oxide layer 36 to a thickness of about 2500 Angstroms (this oxide is deposited over the channel region 18 and in aperture 40);
7. Mask layer 36 with layer of photo resist in all areas except aperture 40 and etch the oxide in the aperture 40;
8. Remove mask and grow thin oxide in aperture 40 to thickness of about 90–120 Angstroms over auxiliary channerl region 20;
9. Deposit second level polysilicon layer;
10. Mask and etch second level polysilicon layer to form floating gate 24 and select gate (word line) 30; and
11. Standard processing procedures continue from this point and includes the N+ diffusions for source and drain regions 14 and 16, extensions 15, (independent doped region 42 and doped extension 43 FIG. 2), formation of oxide layer 38 and the formation of contact openings 32 and 34 followed by metallization to form lines 26 and 28, etc.

In FIGS. 1 and 2 I have described a single cell floating gate memory device and for this device to have maximum utility will require more than a single memory cell. Accordingly, it should now be obvious to those skilled in the art that a plurality of these devices may be arranged in rows and columns to form an array wherein various cells in the array may be selected and electrically programmed and read in accordance with the description previously given with regard to FIGS. 1 and 2.

What I claim is:
1. In a floating gate memory device of the type including a body of semiconductor material of a first conductivity type having first and second doped regions of a second conductivity type formed in the semiconductor body at the surface thereof, the first and second doped regions spaced one from the other to define a channel region therebetween in the semiconductor body for supporting current flow between the doped regions, a first conductive layer of polysilicon positioned in a plane parallel to and insulated from the major surface of the body of semiconductor material and a second conductive layer of polysilicon material positioned over both the channel region and the first layer of polysilicon and insulated therefrom, the improvement comprising:
   an extended portion affixed to one of the doped regions, the extended portion having a first section of the second conductivity type adjoining the doped region, and a second section of the first conductivity type adjoining the first section;

the first layer of polysilicon is a program/control line positioned over the second section of the extended portion and adjacent to the doped regions and to the channel region;

a charging window in the first layer of polysilicon aligned with the second section of the extended portion, the window completely surrounded, in its flat plane, by the first layer of polysilicon; and the second layer of polysilicon is a floating gate member having one portion thereof extending over the channel region and another portion substantially shielded from the semiconductor body by the first layer except for that portion of the second layer that extends through the charging window for coupling to the second section of the extended portion.

2. The floating gate memory device of claim 1, wherein:

the first and second doped regions are source and drain regions respectively; and the extended portion is affixed to the source region.

3. The floating gate memory device of claim 2, further comprising:

a word line positioned adjacent the floating gate;

whereby when a voltage of a first value is applied to the drain region, the source region and the word line and 0 (zero) volts to the substrate and the program/control gate, the memory device is erased to a low threshold, high conduction state; and when the drain region, the source region and the substrate has 0 (zero) volts applied thereto and the word line and program/control gate has the voltage of the first value applied, the memory device is written to a high threshold, low conduction state.

4. The floating gate memory device of claim 1, further comprising:

a third doped region; and a second channel region separating the second and third doped regions.

5. The floating gate memory device of claim 4, wherein:

the first and second doped regions are source and drain regions respectively;

the third region is positioned between the channel region and the drain region; and the extended portion is affixed to the third doped region.

6. The floating gate memory device of claim 5, further comprising:

a word line positioned over and insulated from the second channel region and adjacent the floating gate;

whereby when a voltage of a first value is applied to the drain region, the source region and the word line and 0 (zero) volts is applied to both the substrate and the program/control gate, the memory device is erased to a low threshold, high conduction state; and when the drain region, the source region and the substrate has 0 (zero) volts applied thereto and the word line and program/control gate has the voltage of the first value applied, the memory device is written to a high threshold, low conduction state.

7. A floating gate memory device comprising:

A substrate of a first conductivity type;

source and drain regions, of a second conductivity type, formed in the substrate at the surface thereof;

a channel region formed between the source and drain regions;

a first level conductive layer adjacent to and insulated from the substrate and positioned over the channel region;

a second level conductive floating gate layer positioned over the first conductive layer on a side remote from the substrate and insulated from the first conductive layer; and an opening, formed in the first level conductive layer and completely surrounded thereby, through which the second level conductive floating gate layer projects in order to couple to the substrate.

8. The floating gate memory device of claim 7 wherein:

the first conductive layer is a layer of doped polysilicon that is insulated from the substrate surface by a layer of silicon oxide of about 1,000 Angstroms; and the second conductive layer is a layer of doped polysilicon that is insulated from the first conductive layer by a layer of silicon oxide of about 2,500 Angstroms.

* * * * *